(12) United States Patent
Werner et al.

(10) Patent No.: US 6,964,874 B2
(45) Date of Patent: Nov. 15, 2005

(54) VOID FORMATION MONITORING IN A DAMASCENE PROCESS

(75) Inventors: Thomas Werner, Dresden (DE); Peter Hübler, Coswig (DE); Frank Koschinsky, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/259,037

(22) Filed: Sep. 27, 2002

(65) Prior Publication Data

US 2003/0082901 A1 May 1, 2003

(30) Foreign Application Priority Data

Oct. 31, 2001 (DE) ............................... 101 53 763

(51) Int. Cl.[7] ............................................. H01L 21/66
(52) U.S. Cl. .................... 438/14; 438/637; 438/638; 438/666; 438/672; 438/687
(58) Field of Search .......................... 438/14, 637, 638, 438/666, 672, 687; 257/48

(56) References Cited

U.S. PATENT DOCUMENTS

| | | | | |
|---|---|---|---|---|
| 5,821,168 | A | * | 10/1998 | Jain ............................ 438/692 |
| 6,103,539 | A | * | 8/2000 | Schaffer et al. ................ 438/4 |
| 6,252,227 | B1 | * | 6/2001 | Tseng et al. ................ 250/307 |
| 6,253,621 | B1 | * | 7/2001 | Jarvis ........................... 73/655 |
| 6,294,396 | B1 | | 9/2001 | Nogami et al. ............... 438/16 |
| 6,351,516 | B1 | * | 2/2002 | Mazor et al. .................. 378/44 |
| 6,498,384 | B1 | * | 12/2002 | Marathe ...................... 257/520 |
| 2002/0125905 | A1 | * | 9/2002 | Borden et al. ............... 324/765 |
| 2002/0168786 | A1 | * | 11/2002 | Langer et al. ................. 438/14 |
| 2004/0026693 | A1 | * | 2/2004 | McLaughlin et al. ......... 257/48 |
| 2005/0112788 | A1 | * | 5/2005 | Borden et al. ................ 438/14 |

FOREIGN PATENT DOCUMENTS

WO    WO01/80304    10/2001

OTHER PUBLICATIONS

Kelvin, Y. Y. et al., "Stress-Induced Voiding and Its Geometry Dependency Characterization," IEEE 41st Annual International Reliability Physics Symposium 2003, pp. 156-160.*

Lin, M. H. et al., "Comparison of Copper Interconnect Electromigration Behaviors in Various Structures for Advanced BEOL Technology," IEEE Proceedings of 11th IPFA 2004, pp. 177-180.*

Park, Byung-Lyul et al., "Mechanisms of Stress-Induced Voids in Multi-Level Cu Interconnects," Proceedings of the IEEE 2002 International Interconnect Technology Conference, Jun. 3-5, 2002 pp. 130-132.*

(Continued)

*Primary Examiner*—Mary Wilczewski
*Assistant Examiner*—Toniae M. Thomas
(74) *Attorney, Agent, or Firm*—Williams, Morgan & Amerson, P.C.

(57) ABSTRACT

The invention provides a technique of monitoring the void formation in a damascene interconnection process. According to the invention, a test structure is provided that includes at least two damascene structures that have at least one different cross-sectional geometric parameter. To monitor the void formation, the test structure is cut to expose a cross-sectional view to the damascene structures. The cross-sectional view is then inspected and the void formation is investigated in each of the damascene structures. The invention is particularly applicable to multi-level copper-based dual-damascene interconnection processes to monitor the voiding at the interface between barrier layers and bottom metal trenches. The invention allows monitoring of the void formation by locating only one structure on the chip and performing only one cut.

43 Claims, 6 Drawing Sheets

OTHER PUBLICATIONS

Reid et al., "Optimization of Damascene Feature Fill for Copper Electroplating Process," IEEE International Conference Interconnect Technology 1999, May 24-26, 1999 pp. 284-286.*

Oshima et al., "Improvement of Thermal Stability of Via Resistance in Dual Damascene Copper Interconnection," International Electron Devices Meeting, 2000. IEDM Technical Digest, Dec. 10-13, 2000 pp. 123-126.*

Hu et al., "Bimodal Electromigration Mechanisms in Dual-Damascene Cu Line/Via on W," Proceedings of the IEEE 2002 International Interconnect Technology Conference, 2002. Jun. 3-5, 2002 pp. 133-135.*

Guldi et al., "Characterization of Copper Voids in Dual Damascene Processes," Advanced Semiconductor Manufacturing 2002 IEEE/SEMI Conference and Workshop, Apr. 30-May 2, 2002 pp. 351-355.*

Gill et al., "Investigation of Via-Dominated Multi-Modal Electromigration Failure Distrubutions in Dual Damascene Cu Interconnects with a Discussion of the Statistical Implications," 40th Annual Reliability Physics Symposium Proceedings, Apr., 2002.*

Sakata et al., "Solid Phase Replacement Process for Multilevel High-Aspect Ration Al Fill Applications," Proceedings of the IEEE 1998 International Interconnect Technology Conference, 1998. Jun. 1-3, 1998 pges 81-83.*

Yoshida et al., "Stress-Induced Voiding Phenomena for an Actual CMOS LSI Interconnects," International Electron Devices Meeting, 2002. IEDM '02 Digest, Dec. 8-11, 2002 pp. 753-756.*

Gan et al., "Contrasting Failure Characteristics of Different Levels of Cu Dual-Damascene Metallization," Proceedings of the International Symposium on the Physical and Failure Analysis of Integrateed Circuits, 2002. Jul. 8-12, 2002 pp. 124-128.* von Glascow, A. et al., "New Approaches for the Assessment of Stress-Induced Voiding in Cu Interconnects," Proceedings of the IEEE 2002 International Interconnect Technology Conference, 2002. Jun. 3-5, 2002 pp. 274-276.*

Ogawa et al., "Stress Induced Voiding Under Vias Conneected to Wide Cu metal Leads," 40th Annual Reliability Physics Symposium Proceedings, 2002. Apr. 7-11, 2002 pp. 312-321.*

Lu et al., "Understanding and Eliminating Defects in Electroplated Cu Films," Proceedings of the IEEE 2001 Interconnect Technology Conference, 2001. Jun. 4-6, 2001 pp. 280-282.*

Ogawa et al., "Statistics of Electromigration Early Failures in Cu/Oxide Dual-Damascene Interconnects," *IEEE 01CH37167, 39$^{th}$ Annual International Reliability Physics Symposium*, Orlando, Florida (2001).

Motte et al., "Damascene Test Structures for the Evaluation of Barrier Layer Performance Against Copper Diffusion," *Microelectronic Engineering* 55:291-296 (2001).

Filippi et al., "Electromigration in AlCu Lines: Comparison of Dual Damascene and Metal Reactive Ion Etching," *Thin Solid Films* 388:303-314 (2001).

Berger et al., "Electromigration Characterization Versus Texture Analysis in Damascene Copper Interconnects," *Mat. Res. Soc. Symp. Proc.* 612:D2.4.1-D2.4.6 (2000).

* cited by examiner

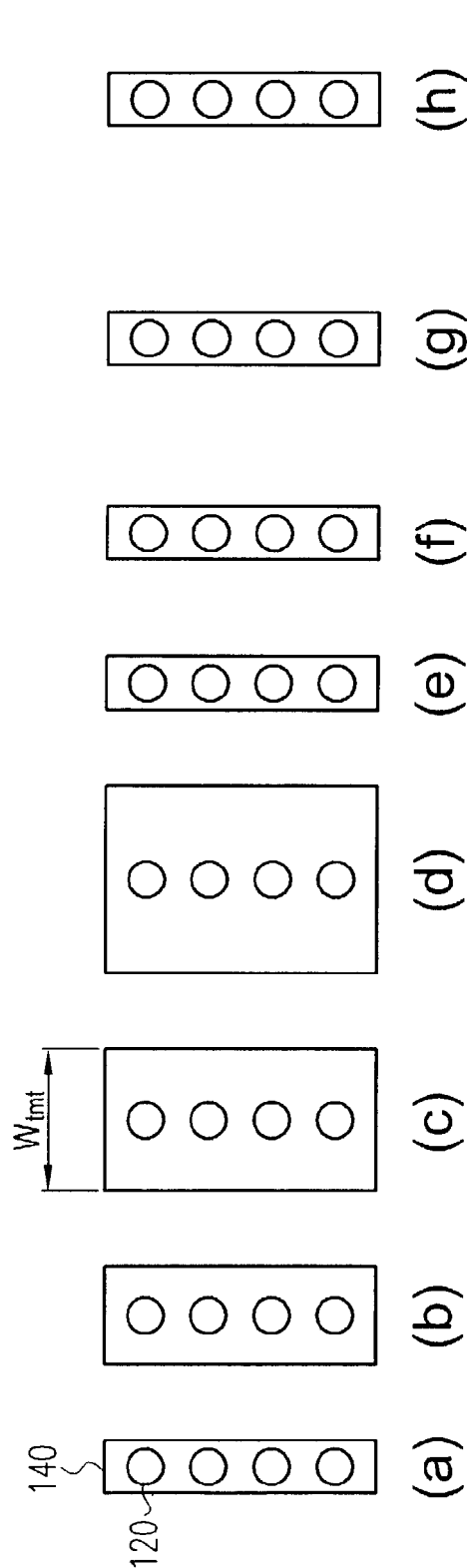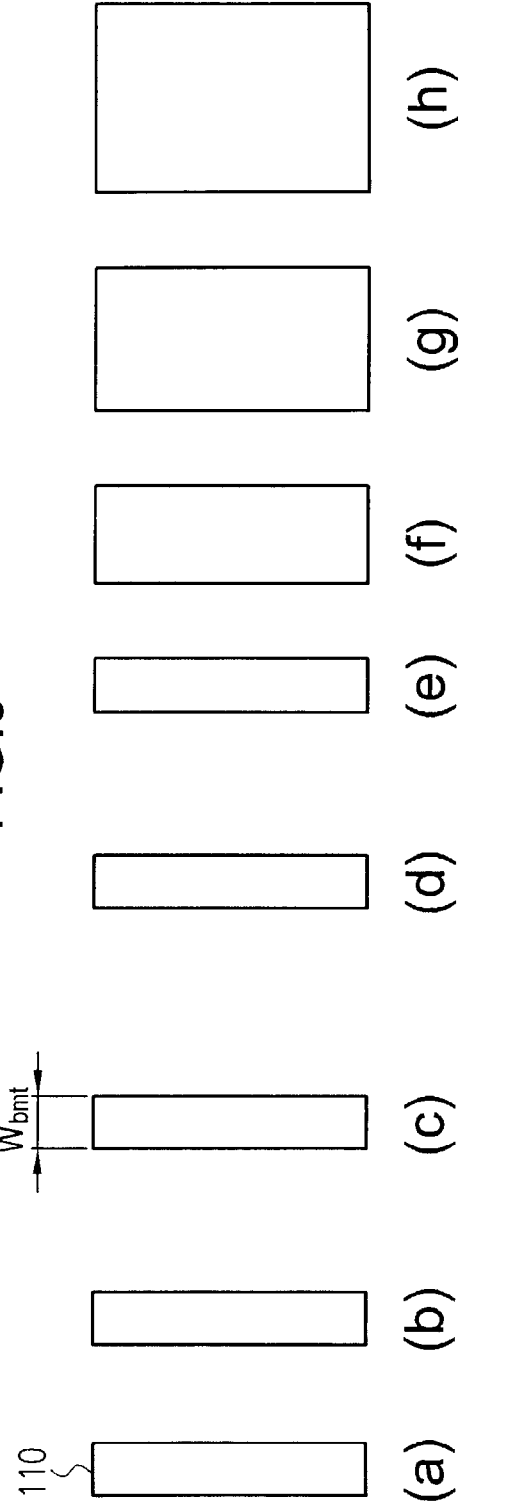

VOID FORMATION MONITORING IN A DAMASCENE PROCESS

BACKGROUND OF THE INVENTION

1. Field of the Invention

The invention generally relates to damascene interconnect processes, and, more particularly, to a technique for monitoring the formation of voids in damascene structures.

2. Description of the Related Art

High density integrated circuits are typically formed with a multi-level interconnect structure having two or more layers of metal interconnects. The lowest level of interconnect wires is typically in contact with active regions of a semiconductor substrate but can also be in contact with, for instance, a conductor that leads to other devices that form part of a larger multi-chip structure. The different levels of interconnect wires are connected by metal plugs formed in openings in layers of insulating material that separate the levels of interconnect wires.

An important capability in the present art of semiconductor manufacturing is the damascene technology. That interconnect fabrication technology forms an interconnect structure by (i) etching a trench or via into a dielectric material, (ii) depositing the interconnect metallization to fill the trench or via, and then (iii) polishing the metal back to remove any metal from the surface of the substrate. An improvement over this so-called single damascene process is the dual-damascene process in which a second level is involved where a series of holes, i.e., contact holes or vias, are etched and filled, in addition to the trench. Thus, the dual-damascene process permits filling of both the conductive grooves or trenches, and the underlying vias at the same time.

A multi-level metal damascene interconnect structure is shown in FIG. 1. In this structure, a bottom metal trench 110 is formed in a substrate 100 and filled with a metal. On top of the substrate, a first insulating (dielectric) layer 130 is deposited. On top of the insulating layer 130 there is a second insulating layer 150 that has a top metal trench 140. The top metal trench 140 and the bottom metal trench 110 are interconnected by means of a via 120 which is a contact hole in the first insulating layer 130. The via 120 and the top metal trench 140 are filled with a metal.

As structures comprising integrated microelectronic circuitry continue to decrease in size, the conducting interconnects decrease in size as well. Smaller conducting interconnects must be composed of materials with lower resistivity. For this reason, copper has in recent times found more application in the use of metal wires because it offers significant advantages due to its low resistivity. The conductivity of copper is twice the conductivity of aluminum and three times the conductivity of tungsten, and copper thin films offer even lower resistivity than gold films. Copper has, therefore, been applied to damascene and dual-damascene schemes.

In copper damascene backend technologies, copper is normally deposited by using electroplating techniques. Electroplating of metals is a process that is widely used in the printed circuit board and multi-chip module technologies. In integrated circuit chip manufacture, in particular in ULSI (Ultra Large Scale Integration) processes, plating of metals, especially of copper, becomes a very attractive process. Electroplating processes utilize solutions containing ions of the metal to be deposited. In the case of copper, the solutions contain copper sulfate ($CuSO_4$), sulfuric acid ($H_2SO_4$), and water. In electroplating, a relatively thin copper seed layer is deposited on the surface on which it is desired to deposit copper by using an electroplating process. The copper seed layer is immersed in this solution and it is electrically connected to become the cathode. As the positive cupric ions $Cu^{2+}$ arrive at the cathode, they acquire two electrons and are reduced to copper metal, which plates out on the wafer surface. This process is continued until sufficient copper is formed on the wafer surface.

Generally, electroplating processes have high deposition rates and form desirable metallurgy. As mentioned above, copper electroplating requires a thin seed layer of copper that is about 50 nm thick and must first be deposited by some other method, such as chemical vapor deposition (CVD) or physical vapor deposition (PVD), onto an adhesion layer (also called barrier layer). Currently, two materials are used to form the barrier and seed layers. A barrier layer, such as titanium nitride (TiN) or tantalum/titanium nitride (Ta/TaN) or $TaSi_xN_y$, is first deposited, with a copper (Cu) seed layer applied in a second step. To ensure that low-resistance vias are fabricated with high yield, the via pre-clean, barrier-layer deposition and seed-layer deposition steps are usually performed on a single vacuum-integrated sputter tool. The barrier layer and the seed layer together form the so-called base layer.

Turning now to FIG. 2, the electroplating process is depicted in more detail. The base layer deposition is usually preceded by a degas step 210 and a pre-clean sputter etching step 220. Then, the base layer is deposited by first depositing the barrier layer in step 230 and then depositing the seed layer in step 240. The actual copper electroplating process can then be performed in step 250.

The amount of energy introduced during the steps 210 and 220 of degassing and performing a via pre-clean can be relatively high and may heat up the wafer surface to temperatures above 300° C. Depositing the barrier layer and seed layer in steps 230 and 240 will then take place onto the hot wafer surfaces and causes high mechanical stress at the interface between the barrier layer and the copper of the metal line below. This stress can lead to voiding at the interface of the barrier layer to the copper.

Referring back to FIG. 1, the multi-level copper damascene interconnect structure shown in the figure includes the barrier layer 160 formed in step 230, and the seed layer 170 formed in step 240. The barrier layer 160 consisting of, e.g., tantalum (Ta) or tantalum nitride (TaN) has been deposited in step 230 onto the hot surface of the bottom copper trench 110. Thus, in the example of FIG. 1, interface voids could occur at the interface between the barrier layer 160 and the bottom metal trench 110.

Voids at the interface pose a serious reliability risk for the product since they influence the contact properties between the copper in the via 120 and the top metal trench 140, and the copper of the bottom metal trench 110. Due to voids, the contacts can become totally useless, but a more severe problem is that the contact behavior may change with time and may further depend on, e.g., the temperature at which the circuit is operated. Thus, the integrated circuit will no longer reliably work.

For this reason, interface voids have to be monitored. However, monitoring the formation of interface voids requires the steps of locating several damascene structures on the wafer, cross-sectioning the structures, and then observing the interface voids. To reliably monitor the occurrence and density of interface voids, it is therefore necessary to investigate a number of different structures since, on one and the same chip, some structures may have no voids while other structures do have voids. Due to the great effort involved in generating the samples for cross-section analysis, the inline interface void monitoring process is a very time-consuming process that slows down the integrated circuit development and manufacturing and further increases the production costs.

The present invention is directed to a method that may solve, or at least reduce, some or all of the aforementioned problems.

SUMMARY OF THE INVENTION

The present invention has been made in consideration of the above situation and intends to provide a monitoring technique that is more efficient with respect to time consumption and production cost.

The present invention provides a method of monitoring the void formation in a damascene interconnection process, where a test structure is formed that includes at least two damascene structures. The at least two damascene structures differ in at least one cross-sectional geometric parameter value. The test structure is cut to expose a cross-sectional view to the at least two damascene structures. The cross-sectional view is then inspected, and the void formation in each of the at least two damascene structures is investigated.

The invention further provides a method of monitoring the formation of voids in a copper-based dual-damascene interconnection process. A test structure is formed that includes at least two damascene structures. Each of the at least two damascene structures comprises a top metal trench, a bottom metal trench and a via connecting the top metal trench and the bottom metal trench. The top metal trenches or bottom metal trenches of the at least two damascene structures have different widths. Then, the test structure is cut to expose a cross-sectional view to the at least two damascene structures. The cross-sectional view is inspected, and the void formation in each of the at least two damascene structures is investigated.

The invention further provides a method of monitoring the formation of interface voids in a copper-based damascene interconnection process. A test structure is formed that includes at least two damascene structures. The at least two damascene structures differ in at least one cross-sectional geometric parameter. The test structure is cut to expose a cross-sectional view to the at least two damascene structures. The cross-sectional view is then inspected, and the void formation in each damascene structure is investigated. The voids are interface voids.

BRIEF DESCRIPTION OF THE DRAWINGS

The invention may be understood by reference to the following description taken in conjunction with the accompanying drawings, in which like reference numerals identify like elements, and in which:

FIGS. 5a–5h are top views of damascene structures usable in a test structure according to an embodiment of the invention;

FIGS. 6a–6h are graphs providing a top view to the bottom metal trenches used in the damascene structures shown in FIGS. 5a–5h;

Figure 1:
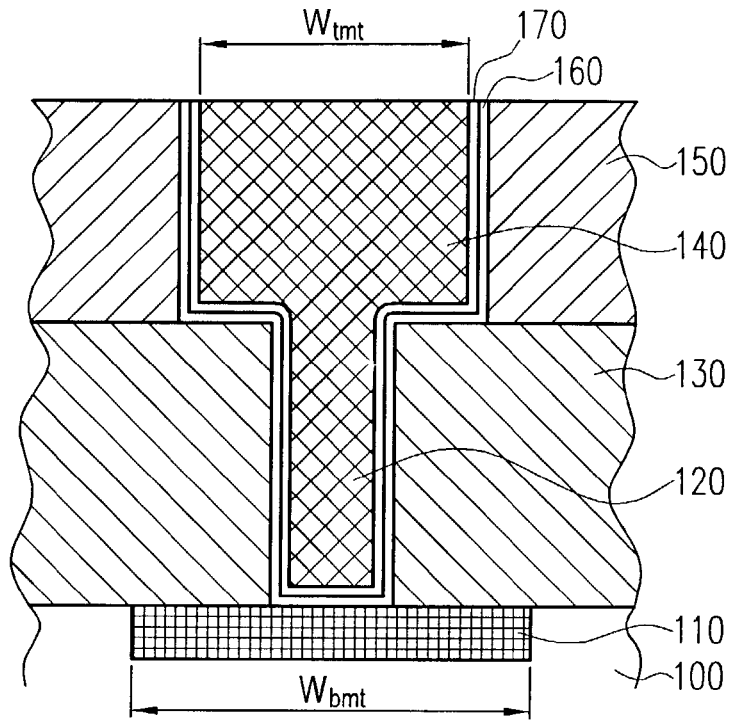
FIG. 1 is a cross-sectional view of a multi-level copper dual-damascene interconnect structure.
Figure 2:
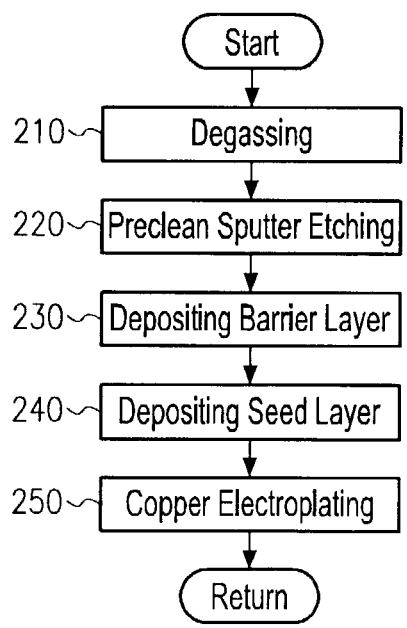
FIG. 2 is a flow-chart illustrating a process of copper electroplating.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

According to the invention, a test structure is provided that allows simple monitoring of interface void formation as a function of geometric parameters such as the top and bottom metal trench widths. Taking the example of using the width of the top metal trenches and/or bottom metal trenches as geometric parameters in the test structure, the effects of changing these parameters are shown in FIGS. 3 and 4.

Figure 3A:
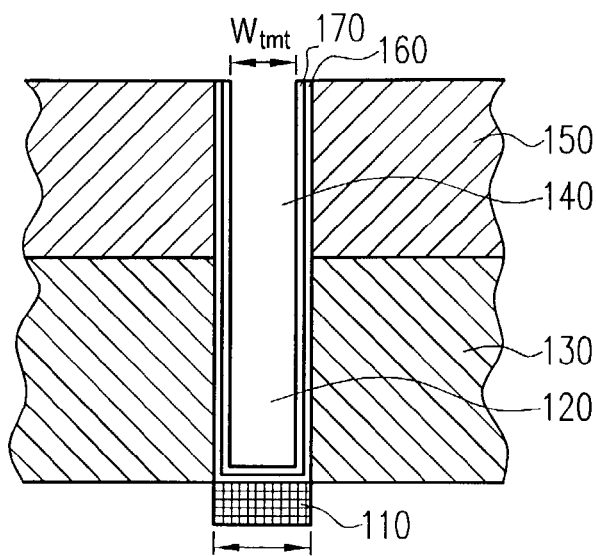
FIGS. 3a–3c are cross-sectional views of damascene structures similar to that of FIG. 1 shown before electroplating, with varying top metal trench widths.
Figure 3B:
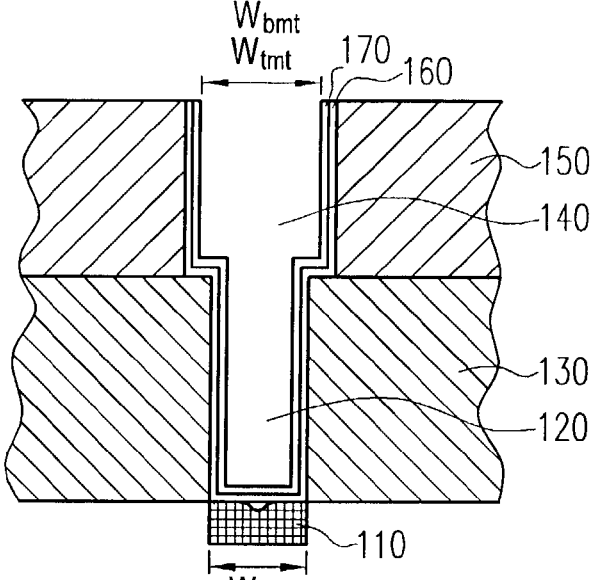
Figure 3C:
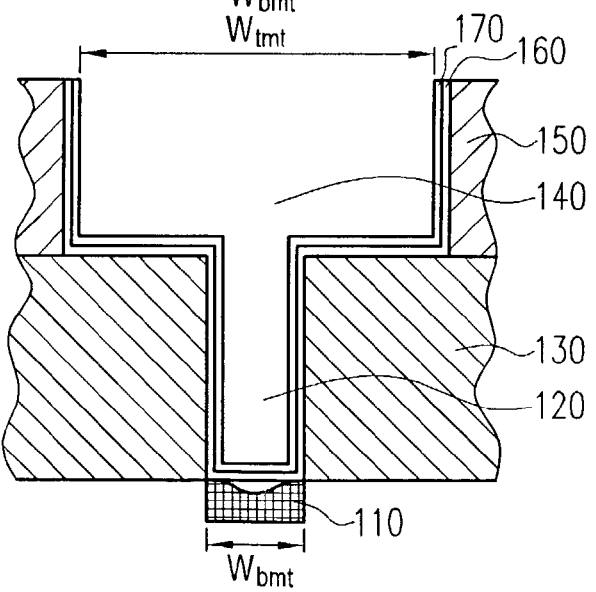

Referring first to FIGS. 3a–3c, the multi-layer copper dual-damascene interconnect structures shown in these drawings resemble the structure shown in FIG. 1 in most of the characteristics. However, the structures of FIGS. 3a–3c are shown before step 250 of electroplating copper is performed, i.e., the top metal trench 140 and the via 120 are not yet filled with copper. Moreover, in the examples of FIGS. 3a–3c, the width $W_{bmt}$ of the bottom metal trench 110 has been arbitrarily chosen to be substantially the same as the width of the via 120.

As can be seen from FIGS. 3a–3c, the structures differ in the widths $W_{tmt}$ of the top metal trenches 140. That is, while in FIG. 3a the top metal trench 140 has been chosen to have approximately the same width as the bottom metal trench 110, the top metal trench width is increased in FIG. 3b to be about twice the width of the bottom metal trench 110. In FIG. 3c, the top metal trench width is increased further to a value that is now significantly larger than the width of the bottom metal trench 110.

Thus, assuming $w_{tmt}$ representing the width of the top metal trench 140 and $w_{bmt}$ representing the width of the bottom metal trench 110, the widths are chosen in FIG. 3a to be of substantially the same value, $w_{tmt}=w_{bmt}$, whereas in FIGS. 3b and 3c $w_{tmt}>w_{bmt}$. According to one illustrative embodiment, by widening the bottom metal trench 110 of the structure of FIG. 3a, structures may be built in which $W_{tmt} < W_{bmt}$.

It has been found that the occurrence and density of the interface voids depend on the width $W_{tmt}$ of the top metal trench 140 as shown in FIGS. 3a–3c such that the void density increases with the top metal trench width. As can be seen in FIG. 3a, there is no interface void at the interface between the barrier layer 160 and the bottom metal trench 110. In FIG. 3b, where the width of the top metal trench 140 has been increased, interface voids appear at the interface, and the void density is still increased in FIG. 3c wherein the width of the top metal trench 140 is further increased. Thus, the width of the top metal trench 140 may be a geometric parameter of relevance for the formation of interface voids in a damascene interconnection process.

Figure 4A:
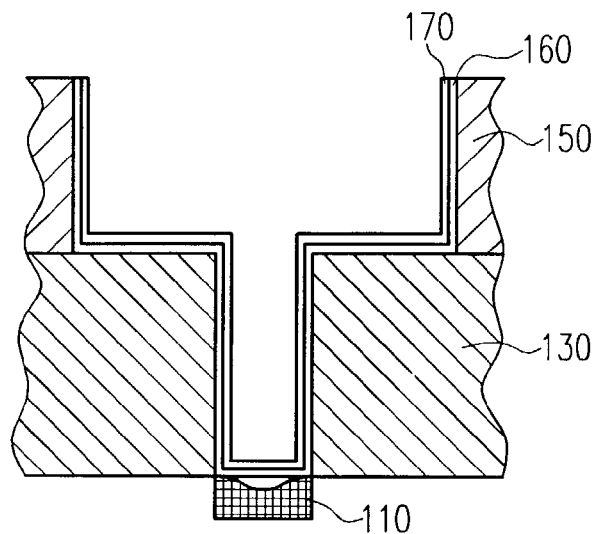
FIGS. 4a–4c are cross-sectional views of damascene structures shown before electroplating, with varying bottom metal trench widths.
Figure 4B:
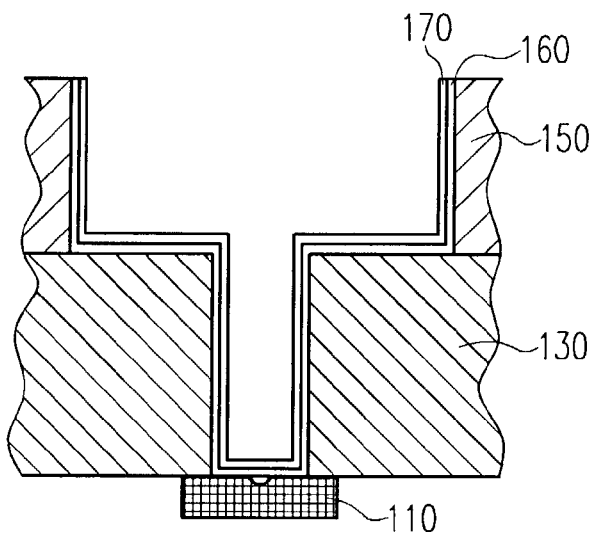
Figure 4C:
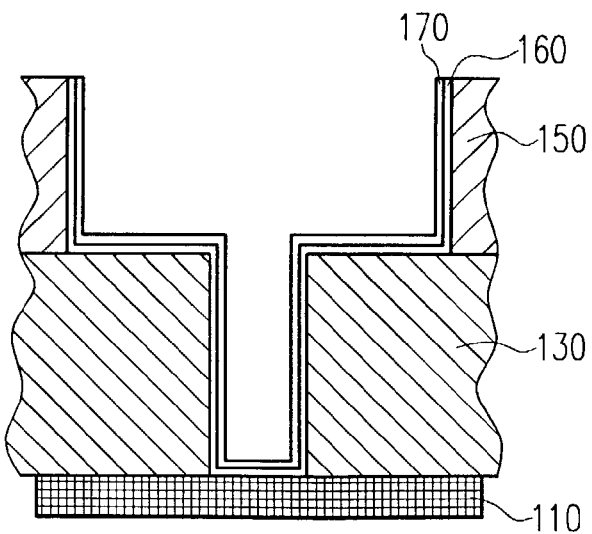

A similar behavior with respect to the occurrence and density of interface voids can be detected in damascene structures of varying bottom metal trench widths. This is depicted in FIGS. 4a–4c where the structure of FIG. 4a is identical to the structure of FIG. 3c. The damascene structures shown in FIGS. 4b and 4c differ from that of FIG. 4a in having increased widths of the respective bottom metal trench 110. While in the example of FIG. 4b, the bottom metal trench width $W_{bmt}$ is still chosen to be less than the top metal trench width $W_{bmt} < W_{tmt}$, the width of the bottom metal trench 110 is increased in the structure of FIG. 4c to a value that exceeds the width of the top metal trench 140 $W_{bmt} > W_{tmt}$.

As can be seen from FIGS. 4a–4c, increasing the width $W_{bmt}$ of the bottom metal trench 110 decreases the interface void density. While in the structure of FIG. 4b there can still be seen that interface voids are formed at the interface between the barrier layer 160 and the copper filled in the bottom metal trench 110, no interface voids can be detected in the structure of FIG. 4c. It will, therefore, be appreciated that another geometric parameter of damascene structures that influences the formation of interface voids is the width $W_{bmt}$ of the bottom metal trench 110.

While the width of the top metal trench 140 and the width of the bottom metal trench 110 has been discussed above as being geometric parameters influencing the formation of interface voids, other cross-sectional geometric parameters defining the structures may affect the formation of voids as well. Cross-sectional geometric parameters are parameters having values that can be determined from inspecting a cross-sectional view of the respective structure. For instance, as the width of the bottom metal trench 110 is a measure of the metal volume below the via 120, the depth and any other geometric measurement of the bottom metal trench 110 may be another parameter of relevance. Further, as mentioned above, the interface voids are the result of mechanical stress due to high wafer surface temperatures during the formation of the barrier layer 160 and/or the seed layer 170. It is, therefore, within the invention to choose those geometric parameters that influence the heat transfer from and to the interface. For instance, the width of the via 120, the length of the via 120, i.e., the thickness of the layer 130, the thickness of the barrier layer 160 and the seed layer 170, the roughness or evenness of the interface between the barrier layer 160 and the bottom metal trench 110, the ratio of the bottom metal trench width and the width of the via 120, and so on, could be used for estimating the quality of the damascene structures and, thus, the quality and stability of the process involved.

Using such damascene structures, and in particular the structures shown in FIGS. 3a–3c and 4a–4c, a test structure can be formed that can be cut so as to expose a cross-sectional view to all or some of the damascene structures. For instance, when forming a test structure from the damascene structures shown in FIGS. 3a–3c, cutting this test structure to expose the cross-sectional views of FIGS. 3a–3c, inspecting these views and investigating the void formation in these structures, it can be seen that there is a critical top metal trench width that is somewhere between the widths of the top metal trenches 140 of the structures of FIGS. 3a and 3b. It can, therefore, be concluded in this example that damascene structures having top metal trench widths below this critical value will have substantially no interface voids, whereas structures having wider top metal trenches 140 will most likely have a significant amount of voids and may, therefore, not function reliably. The invention, therefore, allows one to advantageously monitor the occurrence and density of interface voids depending upon geometric design parameters, such as the top metal trench width, simply by performing one cut and inspecting the cross-sectional view of this cut, for instance using an FIB (focused ion beam) and an SEM (scanning electron microscopy) tool.

While a test structure incorporating the damascene structures of FIGS. 3a–3c can be used to determine a critical top metal trench width, a corresponding critical bottom metal trench width can be determined when using the damascene structures of FIGS. 4a–4c. In this example, inspecting the cross-sectional views of FIGS. 4a–4c, the critical bottom metal trench width can be determined to be somewhere between the bottom metal trench widths of FIGS. 4b and 4c. Having determined this critical value, it can, therefore, be concluded that damascene structures having wider bottom metal trenches 110 will not have formed interface voids.

The critical top metal trench width and the critical bottom metal trench width each may depend on the respective widths of the other trench. For instance, forming a test structure including damascene structures similar to those of FIGS. 3a–3c that differ from these structures in having wider bottom metal trenches 110, the critical top metal trench width will be increased. It is, therefore, particularly advantageous to form a test structure incorporating multiple series of damascene structures. For instance, in one embodiment, a test structure may include a first series in line with FIGS. 3a–3c, and a second series that is similar to these structures but have wider bottom metal trenches 110. In another embodiment, two series may be incorporated that are in accordance with the structures of FIGS. 4a–4c having different top metal trench widths. A further embodiment would be to have different series according to both approaches, FIGS. 3a–3c and FIGS. 4a–4c.

As mentioned above, the top metal trench widths and bottom metal trench widths are not the only possible geometric parameters. It is, therefore, within the invention to incorporate other damascene structure series that can be used to determine critical values of further geometric parameters.

Turning now to FIGS. 5a–5h, damascene structures that can be used in a test structure are shown in several top views. In these drawings, the top metal trenches 140 can be seen to have varying widths. Further, there are vias 120 provided. It will be appreciated that the number of vias 120 in each top metal trench 140, as used in FIGS. 5a–5h, has been arbitrarily chosen. Having one via would in principle be sufficient, but it may be advantageous to have more than one via in each damascene structure since this conforms with the actual device structures and gives more liberty in choosing where to perform the cut.

FIGS. 6a–6h are top views of the bottom metal trenches 110 in the damascene structures shown in the respective FIGS. 5a–5h. Again, the bottom metal trench width is varied in these damascene structures. As can be seen for instance from comparing FIGS. 5d and 6d and FIGS. 5h and 6h, a test structure incorporating these damascene structures varies the top metal trench widths and bottom metal trench widths covering a range that include both $w_{tmt} > w_{bmt}$ and $W_{tmt} < W_{bmt}$.

Figure 7:
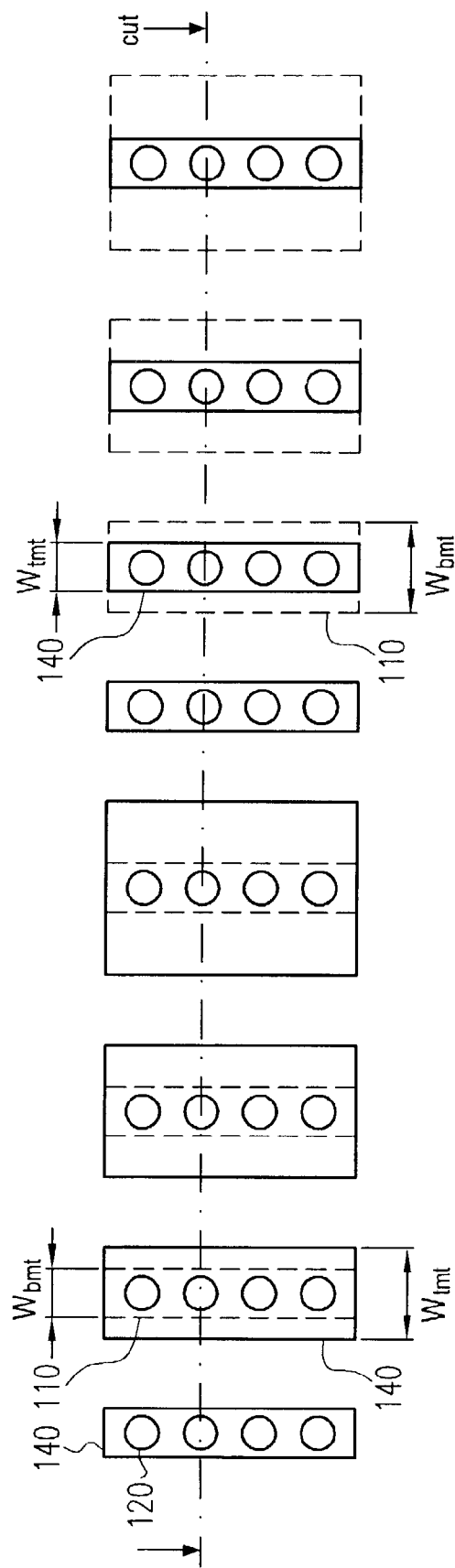
FIG. 7 is a top view of a test structure incorporating the damascene structures of FIGS. 5a–5h and 6a–6h.

Such a test structure is shown in FIG. 7. Furthermore, in this figure, an example of performing a cut is shown. In this cut, the second line of vias has been chosen to be inspected. Although other arrangements of damascene structures in such a test structure would be possible, it is advantageous to arrange the damascene structures as a one-dimensional array, as shown in FIG. 7, as this simplifies the cutting process.

Figure 8:
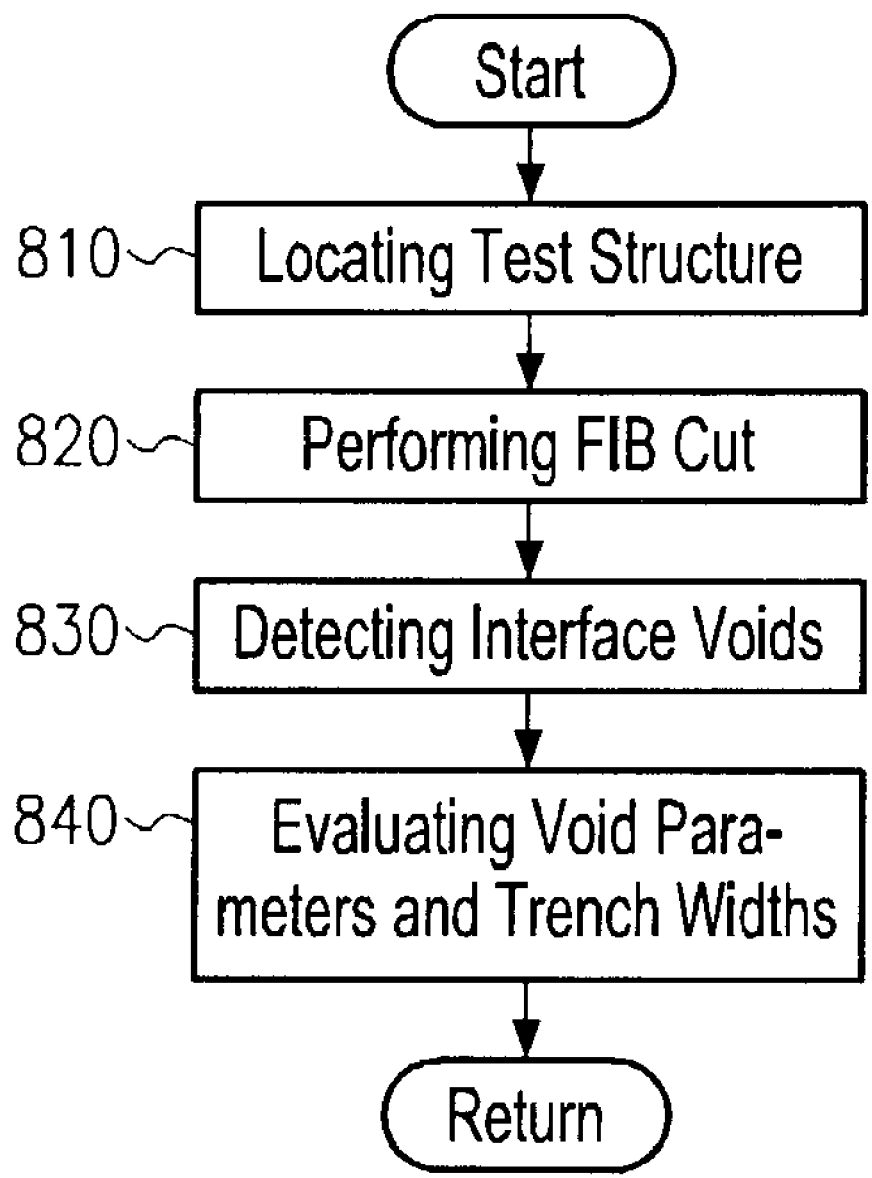
FIG. 8 is a flowchart illustrating the process of monitoring the formation of interface voids according to an embodiment of the invention.

Turning now to FIG. 8, the process of monitoring the formation of interface voids according to an embodiment of the invention starts with step 810 of locating the test structure that had been formed in advance. Once the test structure is located, it is aligned and oriented to perform the cut in step 820. As mentioned above, the invention advantageously allows for gathering all the necessary information on the void formation simply by locating only one (test) structure and performing only one cut.

Then, it is determined in step 830 whether interface voids are present in all or some of the tested damascene structures, and the void parameters are evaluated in relation to the geometric parameters in step 840. Void parameters are, for instance, the occurrence of voids, the size of voids, and the density of voids.

While the invention has been described with respect to physical embodiments constructed in accordance therewith, it will be apparent to those skilled in the art that various modifications, variations and improvements of the present invention may be made in the light of the above teachings and within the purview of the appended claims without departing from the spirit and intended scope of the invention.

For instance, while the invention has been described in the context of multi-level copper dual-damascene interconnect structures having seed and barrier layers, it will be appreciated that the invention is of particular advantage in these structures but is not limited to this technique. For instance, the monitoring scheme of the invention could be applied to other metals than copper. Furthermore, the test structures are also useful in single-damascene interconnection processes. It is further apparent to those of ordinary skill in the art that the invention is not limited to monitoring the formation of voids that occur at the interface of the barrier layer 160 and the bottom metal trench 110. Instead, the invention can be used to monitor the formation of other voids that are formed in damascene structures.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of monitoring the void formation in a damascene interconnection process, the method comprising:
    forming a test structure including at least two damascene structures, said at least two damascene structures differing in at least one cross-sectional geometric parameter value;
    cutting the test structure to expose a cross-sectional view to said at least two damascene structures;
    inspecting said cross-sectional view; and
    investigating the void formation in each of said at least two damascene structures.

2. The method of claim 1, wherein said at least two damascene structures are multi-level damascene interconnect structures.

3. The method of claim 2, wherein each of said at least two multi-level damascene interconnect structures includes a bottom metal trench and a top metal trench, the bottom mental trench and the top metal trench being connected by at least one via.

4. The method of claim 3, wherein said bottom metal trench is filled with copper.

5. The method of claim 3, wherein said top metal trench is filled with copper.

6. The method of claim 3, wherein said at least two multi-level damascene interconnect structures have different top metal trench widths and substantially the same bottom metal trench widths.

7. The method of claim 3, wherein said at least two multi-level damascene interconnect structures have different bottom metal trench widths and substantially the same top metal trench widths.

8. The method of claim 3, wherein said at least two multi-level damascene interconnect structures have different top metal trench widths and different bottom metal trench widths.

9. The method of claim 8, wherein forming a test structure comprises:
    forming a first series of damascene structures having varying top metal trench widths and substantially the same bottom metal trench width; and
    forming a second series of damascene structures having varying bottom metal trench widths and substantially the same top metal trench width, wherein said first and second series are formed in an one-dimensional array.

10. The method of claim 8, wherein one of said at least two damascene structures has a bottom metal trench that is wider than its top metal trench whereas the other one of said at least two damascene structures has a top metal trench that is wider than its bottom metal trench.

11. The method of claim 3, wherein forming a test structure includes forming a first and a second series of damascene structures, and
    in the first series, the widths of either the top metal trenches or the bottom metal trenches are each set to a first predetermined value,
    in the second series, the widths of those trenches that have been chosen in the first series to have widths of the first value are set to a second predetermined value,
    said first value being different from said second value, and
    the trenches in the first and second series that have not been chosen to have widths of the first or second value having widths being varied within each series.

12. The method of claim 1, wherein said damascene interconnection process is a copper-based damascene interconnection process.

13. The method of claim 2, wherein said copper-based damascene interconnect process includes a copper electroplating process.

14. The method of claim 13, wherein said at least two damascene structures each comprise at least one of a barrier layer and a copper seed layer.

15. The method of claim 14, wherein at least one of said barrier layers and seed layers cover the side walls and the bottom of a via so as to form an interface to a bottom metal trench of the damascene structures.

16. The method of claim 15, wherein said void formation is the formation of voids at the interface between the at least one of said barrier layer and said seed layer and said bottom metal trench.

17. The method of claim 1, wherein said at least two damascene structures are single-damascene structures.

18. The method of claim 1, wherein said at least two damascene structures are dual-damascene structures.

19. The method of claim 1, wherein cutting and inspecting are performed using an FIB (focused ion beam) and an SEM (scanning electron microscopy) tool.

20. The method of claim 1, wherein investigating the void formation includes detecting the occurrence of voids.

21. The method of claim 1, wherein investigating the void formation includes determining the size of voids.

22. The method of claim 1, wherein investigating the void formation includes determining the density of voids.

23. A method of monitoring the formation of voids in a copper-based dual-damascene interconnection process, the method comprising:
   forming a test structure including at least two damascene structures, each of said at least two damascene structures comprising a top metal trench, a bottom metal trench and a via connecting the top metal trench and the bottom metal trench, one of the top metal trenches and the bottom metal trenches of said at least two damascene structures having different widths;
   cutting the test structure to expose a cross-sectional view to said at least two damascene structures;
   inspecting said cross-sectional view; and
   investigating the void formation in each of said at least two damascene structures.

24. The method of claim 23, wherein said copper-based damascene interconnection process includes a copper electroplating process.

25. The method of claim 23, wherein said at least two damascene structures comprise at least one of a barrier layer and a copper seed layer, wherein the method is used for monitoring the formation of voids at the interface between the at least one of the barrier layer and the seed layer and said bottom metal trench.

26. The method of claim 23, wherein said at least two multi-level damascene interconnect structures have different top metal trench widths and different bottom metal trench widths.

27. The method of claim 26, wherein forming a test structure comprises:
   forming a first series of damascene structures having varying top metal trench widths and substantially the same bottom metal trench width; and
   forming a second series of damascene structures having varying bottom metal trench widths and substantially the same top metal trench width;
   wherein said first and second series are formed in a one-dimensional array.

28. The method of claim 26, wherein one of said at least two damascene structures has a bottom metal trench that is wider than its top metal trench whereas the other one of said at least two damascene structures has a top metal trench that is wider than its bottom metal trench.

29. The method of claim 23, wherein investigating the void formation includes detecting the occurrence of voids.

30. The method of claim 23, wherein investigating the void formation includes determining the size of voids.

31. The method of claim 23, wherein investigating the void formation includes determining the density of voids.

32. The method of claim 23, wherein cutting and inspecting are performed using an FIB (focused ion beam) and an SEM (scanning electron microscopy) tool.

33. A method of monitoring the formation of interface voids in a copper-based damascene interconnection process, the method comprising:
   forming a test structure including at least two damascene structures, said at least two damascene structures differing in at least one cross-sectional geometric parameter value;
   cutting the test structure to expose a cross-sectional view to said at least two damascene structures;
   inspecting said cross-sectional view; and
   inspecting the void formation in each of said at least two damascene structures, the voids being interface voids.

34. The method of claim 33, wherein each of said at least two damascene structures comprises a bottom metal trench filled with copper, a top metal trench filled with copper, and at least one via filled with copper and connecting the bottom metal trench and the top metal trench.

35. The method of claim 34, wherein either the top metal trenches or the bottom metal trenches of said at least two damascene structures have different widths, the other one of the top metal trenches and bottom metal trenches of said at least two damascene structures being of substantially the same width.

36. The method of claim 35, wherein each of said at least two damascene structures are multi-level damascene interconnect structures having different top metal trench widths and different bottom metal trench widths.

37. The method of claim 36 wherein forming a test structure comprises:
   forming a first series of damascene structures having varying top metal trench widths and substantially the same bottom metal trench width; and
   forming a second series of damascene structures having varying bottom metal trench widths and substantially the same top metal trench width, wherein said first and second series are formed in a one dimensional array.

38. The method of claim 36, wherein one of said at least two damascene structures has a bottom metal trench that is wider than its top metal trench whereas the other one of said at least two damascene structures has a top metal trench that is wider than its bottom metal trench.

39. The method of claim 33, wherein said copper-based damascene interconnection process is a dual-damascene process that includes a copper electroplating process, and said at least two damascene structures comprise a barrier layer and a copper seed layer.

40. The method of claim 33, wherein cutting and inspecting are performed using an FIB (focused ion beam) and an SEM (scanning electron microscopy) tool.

41. The method of claim 33, wherein investigating the void formation includes detecting the occurrence of voids.

42. The method of claim 33, wherein investigating the void formation includes determining the size of voids.

43. The method of claim 33, wherein investigating the void formation includes determining the density of voids.

* * * * *